United States Patent
White et al.

(10) Patent No.: US 6,744,312 B2
(45) Date of Patent: Jun. 1, 2004

(54) ADAPTIVE POWER AMPLIFIER SYSTEM

(75) Inventors: Paul E. White, York, PA (US); Robert W. Kooker, Freeland, MD (US)

(73) Assignee: Andrew Corporation, Orland Park, IL (US)

(*) Notice: Subject to any disclaimer, the term of this patent is extended or adjusted under 35 U.S.C. 154(b) by 8 days.

(21) Appl. No.: 10/090,857

(22) Filed: Mar. 5, 2002

(65) Prior Publication Data

US 2002/0125944 A1 Sep. 12, 2002

Related U.S. Application Data

(60) Provisional application No. 60/273,746, filed on Mar. 6, 2001.

(51) Int. Cl.[7] .............................. H03F 1/14; H03F 3/68
(52) U.S. Cl. .................. 330/51; 330/124 D; 330/124 R
(58) Field of Search ........................ 330/51, 124 D, 330/124 R, 295

(56) References Cited

U.S. PATENT DOCUMENTS

| | | | |
|---|---|---|---|
| 4,315,222 A | 2/1982 | Saleh | 330/174 |
| 4,755,769 A * | 7/1988 | Katz | 330/295 |
| 4,780,685 A * | 10/1988 | Ferguson | 330/124 D |
| 5,206,604 A | 4/1993 | Vaninetti | 330/124 |
| 5,543,751 A * | 8/1996 | Stedman et al. | 330/124 D |
| 5,561,395 A | 10/1996 | Melton et al. | 330/2 |
| 5,786,727 A | 7/1998 | Sigmon | 330/124 |
| 5,862,459 A | 1/1999 | Charas | 455/114 |
| 5,867,064 A | 2/1999 | Van Horn et al. | 330/149 |
| 5,872,481 A * | 2/1999 | Sevic et al. | 330/51 |
| 5,986,500 A | 11/1999 | Park et al. | 330/124 |
| 6,023,612 A | 2/2000 | Harris et al. | 455/127 |
| 6,091,715 A | 7/2000 | Vucetic et al. | 370/277 |

* cited by examiner

Primary Examiner—Steven J. Mottola
(74) Attorney, Agent, or Firm—Wood, Herron & Evans, LLP

(57) ABSTRACT

The present invention provides a power amplifier system in which one or more power amplifiers may be inserted. The occupancy of ports by power amplifiers is monitored by a controller. The system has a plurality of output lines, each with different electrical line characteristics. The controller is responsive to ports becoming occupied or unoccupied by power amplifiers and routes the output signal through the output line having the electrical line characteristics that ensure an efficient signal transfer. Further, the switching configuration of the present invention eliminates the need for output signals to traverse through a switch.

45 Claims, 3 Drawing Sheets

ADAPTIVE POWER AMPLIFIER SYSTEM

RELATED APPLICATION

This application claims the filing benefit and priority of U.S. Provisional Application entitled "Adaptive Power Amplifier with Variable Outputs," Ser. No. 60/273,746,; filed Mar. 6, 2001, and incorporates that application by reference herein in its entirety.

FIELD OF THE INVENTION

The present invention generally relates to a power amplifier system used in telecommunication systems and more specifically to an adaptive system for efficiently combining and transmitting signals created by one or more power amplifiers.

BACKGROUND OF THE INVENTION

Wireless communication signals received by antennas are often very weak. Therefore, power amplifiers are widely used in wireless transmission systems to increase the signal strength of the received wireless signal. Oftentimes, wireless transmission systems will utilize more than one power amplifier. For example, a plurality of amplifiers may be required because several different carrier signals must be amplified separately. In another scenario, more than one amplifier is required to provide an output signal with the requisite signal strength. The outputs of the plurality of amplifiers is commonly combined into a single output signal by a signal combiner.

Generally, two classes of power amplifiers exist for handling different types of transmission signals. Multi-Carrier Power Amplifiers (MCPAs) are used in amplifier modules designed to handle wideband signals (i.e., signals containing more than one carrier frequency). MCPAs are used to amplify signals containing multiple carriers. An alternative to MCPAs, are Single Carrier Power Amplifiers (SCPAs). SCPAs are limited to amplifying signals containing essentially only one carrier frequency. Therefore, before using an SCPA, a wideband signal having multiple carriers must be divided into individual signals, each generally containing only one carrier frequency. Each of these single carrier signals is then amplified by a separate SCPA.

The use of MCPAs offers a cost effective alternative to the use of numerous SCPAs for applications requiring high signal density in a wireless base station. However, utilizing a single MCPA has certain drawbacks. If a single MCPA fails in the operating environment, it has the potential of disabling the entire wideband transmission signal, including all the associated carrier frequencies, as opposed to affecting only one carrier frequency if an SCPA were to fail. Therefore, a level of redundancy is desirable for MCPAs implemented within a power amplifier scheme of a transmission system. Such a system of redundancy would also be useful in SCPA systems. Such redundancy would ensure that all of the carrier signals are not lost due to a single amplifier failure.

It is also often desirable to increase the number of carriers that may be amplified by an SCPA system. Such a system must allow additional SCPAs to be easily added to the power amplifier system.

Within a wireless transmission system, it is often desirable to upgrade or modify the system by adding additional amplification. Since the output power is increased by either replacing existing power amplifiers or adding additional amplifiers, such a system must allow for easy replacement of existing MCPAs or SCPAs or allow for the addition of more MCPAs or SCPAs.

When providing or modifying the amplification features of a wireless system to address such objectives, one possible solution is to construct a combining network consisting of multiple power amplifiers, which also allows additional amplifiers to be added. It also should provide for the amplifiers to be easily removed and replaced if necessary. However, several obstacles must be overcome in order for such a network to be cost effective and efficient.

First, the impedance of the output line of a combiner will vary depending upon the amplifiers in the system. Therefore, the system must address the issue of varying line characteristics at the output of a signal combiner, such as the impedance of the output line, based upon the number of MCPAs or SCPAs inserted within the system. This is an important consideration in order to ensure an efficient transfer of the amplified signals from the signal combiner to the output lines.

Additionally, a system with multiple ports for accepting power amplifiers will experience various levels of input signal loss if any of the ports are empty. Therefore, a solution to the above objectives must address input signal losses based upon the number of ports containing power amplifiers within the system.

Still further considerations involve the types of components utilized in the signal combining network. Conventional systems with multiple power amplifiers often use a large number of switches in order to control the flow of input signals to the various amplifiers. Such switches have various drawbacks. First, switches are inherently lossy electrical devices. Therefore, signal strength decreases each time a signal passes through a switch. Secondly, since switches are mechanical devices, they have a certain degree of unreliability because they are prone to failure. Therefore, a solution to various of the above-discussed issues should also address such unreliability, switch failures, minimize signal loss from switching components, and improve the robustness of the overall system.

DETAILED DESCRIPTION OF EMBODIMENTS OF THE INVENTION

The present invention provides a power amplifier system in which one or more power amplifiers may be readily added or removed. Ports into which the power amplifiers are inserted may be left unoccupied without significantly affecting the overall performance of the system. Furthermore, additional amplifiers may be added to the system as growth or modification is needed. Redundancy is achieved The occupancy of ports by power amplifiers is monitored by a controller for improved efficiency and reduction of signal losses. The system has a plurality of output lines, each with different electrical line characteristics. The controller is responsive to the various ports becoming occupied or unoccupied by power amplifiers, and routes the output signal through the output line having the electrical line characteristics that will ensure an efficient signal transfer. Further, the switching configuration of the present invention eliminates the need for output signals to traverse through a switch.

More specifically, one embodiment of the present invention implements a system for providing efficient power combining of output signals from power amplifiers. A plurality of output lines with different impedance characteristics are provided. A controller detects the number of power amplifiers inserted within the available power amplifier ports. The controller then routes a summed output signal from a combiner to the output line with the most appropriate impedance characteristics. The inventive system requires only one switch for each output line, and the summed output signal does not pass through a switch, thereby eliminating any resulting signal loss.

The invention embodiment also allows for the automatic switchover of one or more redundant power amplifiers in the event of a failure of another power amplifier. Additionally, the invention allows the power amplifier system to be expanded by adding additional amplifiers to the system without requiring the system to be shut down or taken out of service.

Figure 1:
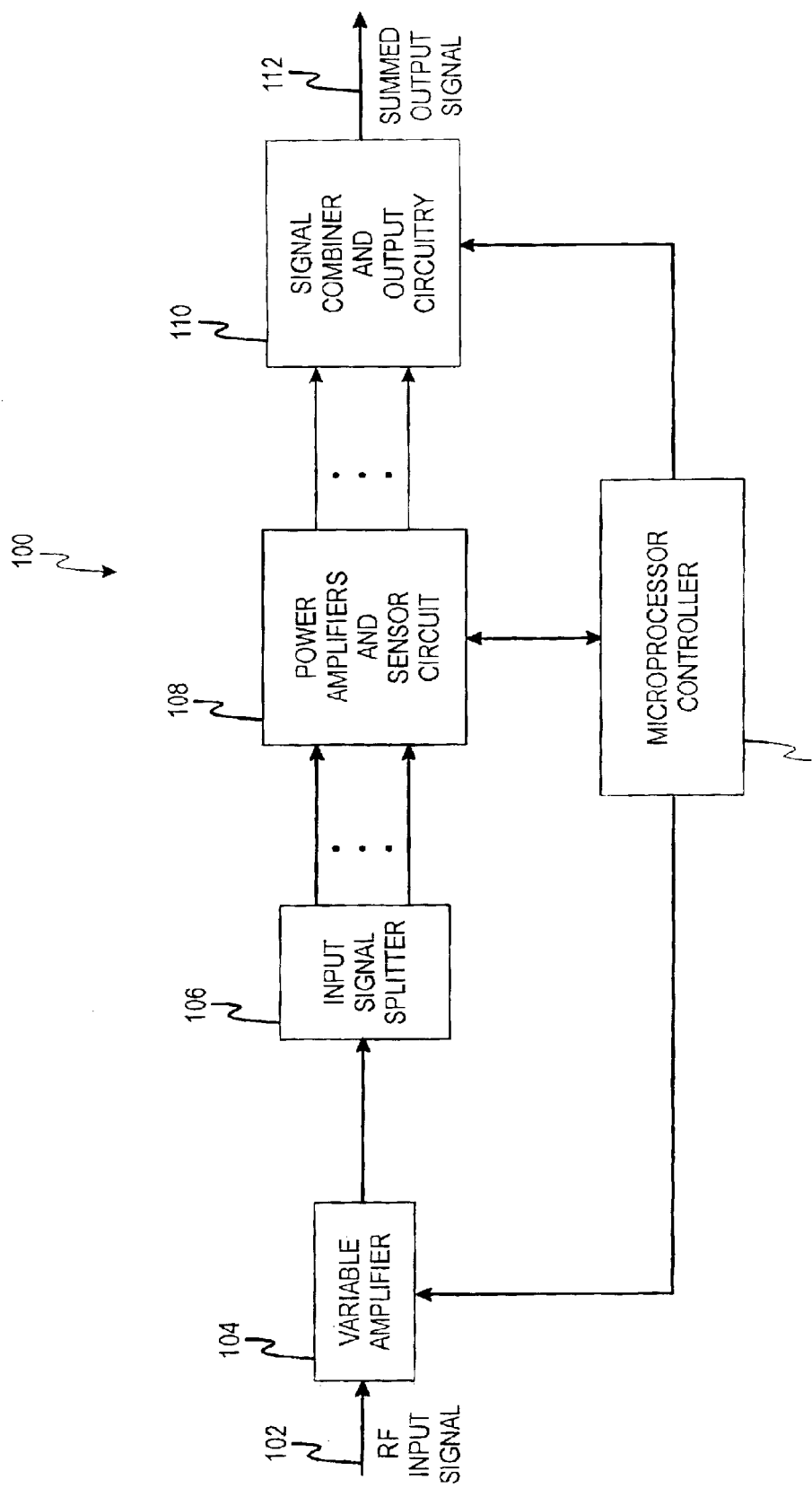
FIG. 1 is a schematic block diagram of a circuit in accordance with one embodiment of the invention.

The system and method of the present invention has particular applicability for amplifying signals received in wireless telecommunication systems, although other uses are contemplated as well. Generally, in a wireless system a wireless radio frequency (RF) signal is routed to an amplifier module. FIG. 1 is a block diagram of an amplifier module 100 constructed according to one embodiment of the present invention. The RF input signal 102 may be provided to the amplifier module 100 from an antenna, from a transmission line, or from any other suitable electronic circuitry. The RF signal 102 is received by a variable amplifier 104 and then forwarded to input signal splitter circuitry 106 that divides the input signal into separate signals directed to a number of available ports capable of accepting power amplifiers. The divided input signal is then routed to the power amplifiers and sensor circuit 108 that contains the plurality of ports into which power amplifiers may be inserted. The sensor circuit 108 generates a control signal that is routed to a microprocessor controller 114 when power amplifiers are inserted or removed. The amplified output signal of each power amplifier is then forwarded to a signal combiner and output circuitry 110 that combines the signals from the power amplifiers creating a summed output signal 112. The controller 114 is also coupled to the output circuitry 110 and routes the summed output signal 112 through the appropriate output circuitry 110 according to the sensed occupancy level of power amplifiers within the amplifier module 100 as indicated by the control signal received from the sensor circuit 108. In that way, output characteristics of the line are taken into consideration and the output signal 112 is routed for maximum power transmission and efficiency. That is, a router will effectively route the output signal based upon parameters associated with the number of amplifiers. In on embodiment, the router includes a controller with various inputs and outputs and associated circuitry.

The amplification applied to the RF input signal 102 by the variable amplifier 104 is also controlled by the controller 114. The amplification level is dependent upon the number of power amplifiers detected by the controller 114 and will be discussed in more detail below.

Figure 2:
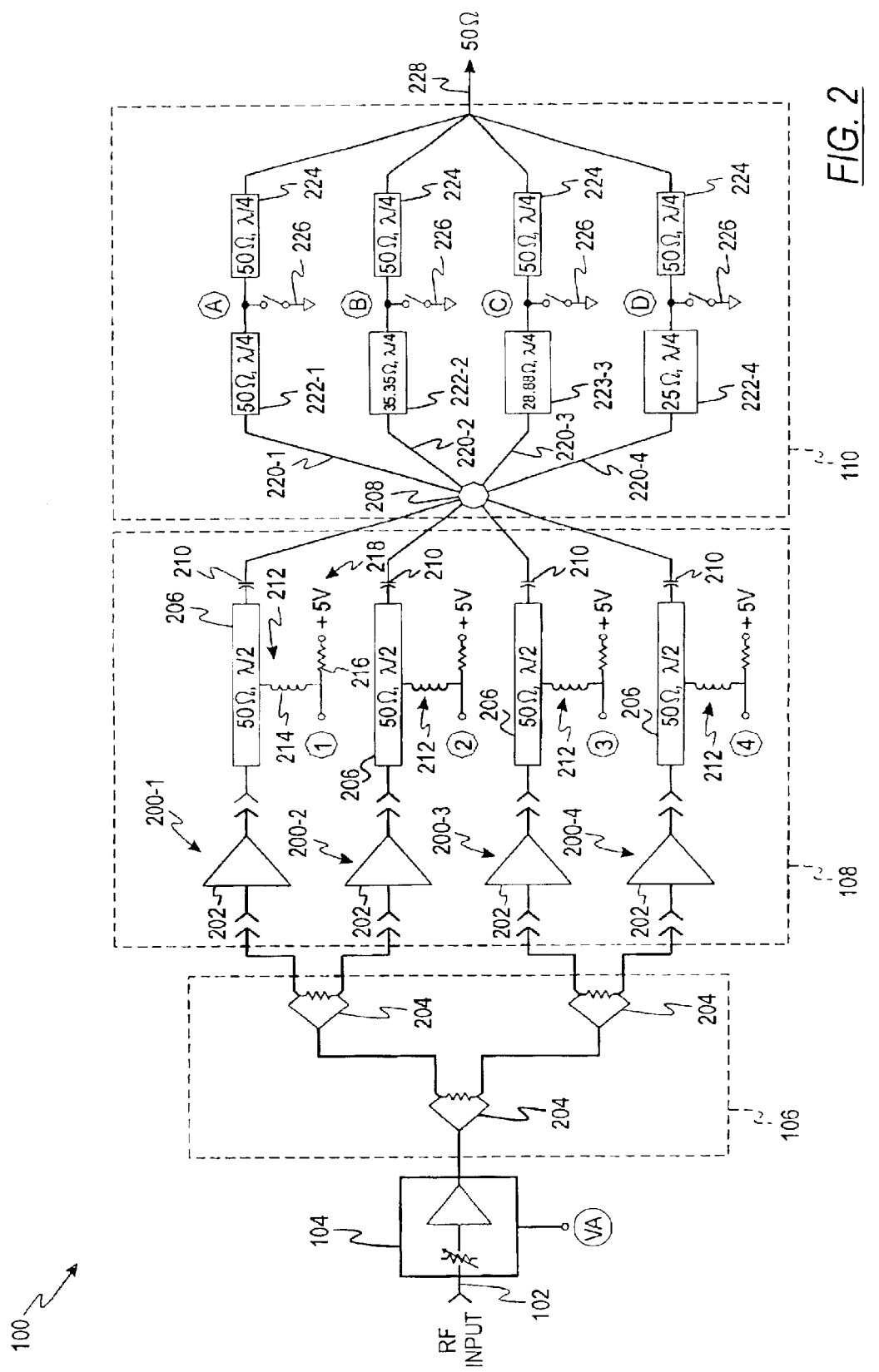
FIG. 2 is a schematic block diagram of an embodiment of an adaptive power amplifier system in accordance with aspects of the present invention.
Figure 3:
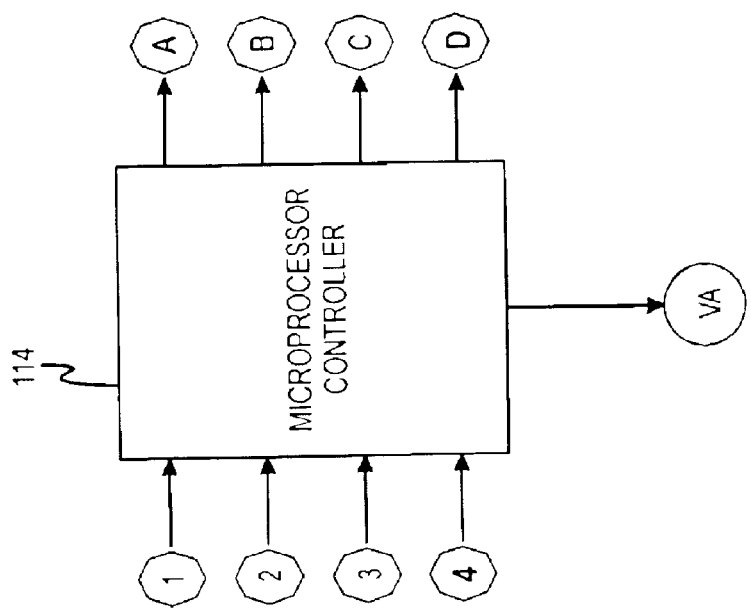
FIG. 3 is a schematic block diagram of a microprocessor controller in one embodiment of the present invention.

A more detailed description of the operation of one embodiment of the invention is set forth below in relation to FIGS. 2 and 3. FIG. 2 depicts an amplifier module with various aspects of the invention, that contains four ports 200-1, 200-2, 200-3, 200-4, each of which is capable of accepting a power amplifier 202. An amplifier module 100 according to the present invention is not limited to having four power amplifiers. A system capable of handling fewer power amplifiers or many more may be realized in accordance with the present invention. The description of the embodiment herein is directed to a system with four power amplifier ports for illustrative purposes only to explain the various aspects of the present invention.

In the embodiment shown in FIG. 2, the input RF signal 102 is fed into the variable amplifier 104. A connection between the variable amplifier 104 and the microprocessor controller 114 is depicted in FIG. 2 as VA. FIG. 3 depicts the controller 114 with connections for VA and sensor circuit nodes 1, 2, 3, and 4 and switching circuit nodes A, B, C, and D which will be discussed in more detail below.

Returning to FIG. 2, the output of the variable amplifier 104 is divided by an input signal splitter 106 and the signals are routed to four ports 200-1, 200-2, 200-3, 200-4 present within the amplifier module 100. In one embodiment, the input signal splitter 106 is comprised of three Wilkinson splitter networks 204. Other acceptable methods for splitting the input signal may also be used. The operation and method for building Wilkinson splitter networks is well known in the art and is described in "An N-Way Hybrid Power Divider" by E. J. Wilkinson, *IRE Transactions on Microwave Theory and Techniques*, Vol. MTT-8, No. 1, January 1960. The outputs of the final stage of Wilkinson splitter networks 204 are coupled with the input side of the power amplifier ports 200-1, 200-2. 200-3, 200-4.

If a port 200 does not contain a power amplifier 202, then the portion of the original RF input signal 102 routed to that port is essentially lost. This phenomenon is known as "split loss." In the preferred embodiment, which contains four ports, if a power amplifier is inserted into only one port, then three-fourths of the original RF input signal 102 will be lost. If two ports contain power amplifiers, then one-half of the original RF input signal will be lost, and so on. However, if all four ports contain a power amplifier, then little or no portion of the original input signal will be lost. The variable power amplifier 104 compensates for any "split losses" by amplifying the RF input signal 102 to ensure the full signal strength of the original RF input signal is received by each power amplifier 200.

In accordance with one aspect of the present invention, the number of amplifiers being utilized is monitored. Using a sensor circuit, the controller 114 determines the number of power amplifiers 202 inserted within the ports 200. As the number of power amplifiers 202 inserted within ports 200 increases, the controller 114 decreases the amplification level of the variable amplifier 104 using the control line VA. If the number of power amplifiers 202 decreases, then the controller 114 will generally increase the amplification level of the variable amplifier 104 accordingly.

In the preferred embodiment with four ports, the variable amplifier 104 will need to amplify the original RF input signal 102 to compensate for a 6 decibel (dB) loss in the RF input signal 102 if only one power amplifier is inserted. A 3 dB loss in the RF input signal 102 must be compensated for if two power amplifiers are inserted. If three power amplifiers are inserted, then the variable amplifier 104 must compensate for a 1.23 dB input signal loss. A 0 dB loss will occur if all ports 200 are occupied by power amplifiers 202. In such an occasion, the variable amplifier generally need not amplify the RF input signal 102.

The output of each port 200 and, specifically, the output of the amplifier 202 associated with the port, is coupled via a section of transmission line 206 to a signal combiner 208. A capacitor 210 may be inserted between the output of each port 200 and the combiner 208 in order to remove any DC components from the amplified signal transmitted from the power amplifier. In one embodiment, the transmission line section 206 has the following line characteristics: an impedance of 50 ohms, and a length of λ/2, where λ is defined as the propagating wavelength of the respective RF input signal 102.

The embodiment depicted in FIG. 2 also has an insert detection circuit 212 coupled to the output of each port 200 for determining which ports are occupied with amplifiers, in accordance with one aspect of the present invention. The insert detection circuit 212 in the embodiment is comprised of an inductor 214 coupled through a resistor 216 to a voltage source 218. The controller 114 is coupled to the insert detection circuits 212 at the sensor circuit nodes identified as 1, 2, 3 and 4 in FIG. 2. When a power amplifier is inserted into a port 200, such as the top-most power amplifier port 200-1, a voltage is generated at node 1 at the detection circuit 212. This voltage is in the form of a control signal that is detected by the controller 114. By detecting this voltage, the controller 114 determines that a power amplifier 202 has been inserted into the port and the port 200-1 is now occupied. Similarly, if a power amplifier 202 is inserted into the second port 200-2, a voltage control signal is generated at node 2 of the insert detection circuit 212, and the controller 114 determines that a second amplifier has been inserted in that respective port. The same occurs at nodes 3 and 4 if power amplifiers 202 are inserted into ports 200-3 or 200-4. If any power amplifier 202 is removed from any one of ports 200-1, 200-2, 200-3 or 200-4, then the voltage at the corresponding node 1, 2, 3 or 4 in the insert detection circuits 212 drops. The controller 114 detects this drop in voltage at the appropriate node and then determines that fewer ports 200 are occupied by power amplifiers.

The use of multiple insert detection circuits as described above is only one method for providing a sensor that indicates when power amplifiers are inserted or removed from the ports 200 of the amplifier module 100. A single sensor may be used to generate a control signal that corresponds to the number of ports 200 containing a power amplifier 202. For instance, insert detection circuitry 212 as described above may be fed into digital circuit components. This digital circuitry may then produce a single control signal indicating the number of ports 200 occupied by power amplifiers 202.

In the embodiment depicted in FIG. 2, the output signals from the various amplifiers are coupled to a combiner 208, and the output of signal combiner 208 is coupled with a plurality of output lines 220-1, 220-2, 220-3, 220-4. In accordance with another aspect of the present invention, each of the output lines has different electrical line characteristics. The signal combiner 208 receives the amplified signal created by each power amplifier 202 inserted in ports 200 and adds these signals together to create a summed output signal. In accordance with the invention, the controller will direct the summed output signal of the combiner to a specific path or paths. In that way, the present invention selects the output characteristics of the output signal based on the existence of amplifiers in specific ports. In the embodiment disclosed herein, in the drawings, the controller 114 routes the summed output signal to one of the output lines 220 coupled to the combiner 208 as is discussed below.

The output lines 220 in each contain a first transmission line segment 222-1, 222-2, 222-3 or 222-4 of a specific length and characteristic impedance. In the disclosed embodiment, for example, the first transmission line segments 222 have a length λ/4 and impedances of 50, 35.35, 28.88 and 25 ohms, respectively. From the combiner, the segments 222 terminate at notes A, B., C, or D. Second transmission line segments 224 of length λ/4 and an impedance of 50 ohms, are also coupled to the nodes A, B, C, and D. A grounding switch 226 is coupled between a ground contact and the nodes connecting the two transmission line segments. In the disclosed embodiment, the grounding switches 226 are of the single-pull single-throw type (SPST); however, a variety of different switch types and/or additional transmission line segments may be used to accomplish the function of creating conditions of high and low impedance, as discussed below.

The first transmission line segment 222 in each output line 220 is used to modify the electrical line characteristics of the respective output lines 220. In one embodiment, the impedance of transmission line segment 222 is varied between each of the different output lines 220. In accordance with one aspect of the invention, the impedance value of each transmission line segment 222-1, 222-2, 222-3 and 222-4 is selected so that the effective impedance presented at nodes A, B, C, and D shown in FIG. 2 is transformed to generally match the impedance of the second output transmission line segments 224, which is 50 ohms. To accomplish this, the impedance values for transmission line segments 222-1, 222-2, 222-3 and 222-4 are selected as one of multiple geometric means between the 50 ohm impedance value of the second output transmission line segment 224 and the various parallel impedance combinations of the number of ports 200 which contain power amplifiers. Depending on the number of amplifiers used, the parallel impedance of the amplifier ports will vary.

For instance, in the disclosed embodiment, if only one of the ports 200 is occupied by a power amplifier, then the effective impedance presented to the input of combiner 208 is 50 ohms. Therefore, to transform this impedance value to match the 50 ohm impedance of the second output transmission line segment 224 at a node (A, B, C, D) the first output transmission line segment 222 must have an impedance value which is the geometric mean of the 50 ohm impedance at the combiner input and the 50 ohm impedance of segment 224, i.e., 50 ohms. This corresponds specifically to segment 222 and node A.

If two ports 200 contain power amplifiers 202, then the impedance presented to the input of the combiner 208 is the parallel combination of 50 ohms and 50 ohms, i.e., 25 ohms. The impedance value of the output transmission line segment 222 is then selected as the geometric mean between 25 and 50 ohms, which is approximately 35.35 ohms. This corresponds to segment 222-2 and node B.

Similarly, if three ports contain power amplifiers, then the combined parallel impedance at the input to combiner 208 is 16.67 ohms, resulting in a value of 28.88 ohms selected as the impedance for output transmission line segment 222-3 and node C. If four power amplifiers are inserted into ports 200, then the impedance value for output transmission line segment 222-4 associated with node D is 25 ohms.

If a power amplifier system is designed to accept more than four power amplifiers, additional output lines can be coupled to the combiner 208 and the necessary impedance values for the first transmission line section 222 calculated according to the method and principles described above.

As discussed above, the controller 114 monitors the voltages at nodes 1, 2, 3 and 4 shown in FIG. 2 in order to determine whether a power amplifier has been inserted into one or more of the ports 200. Based upon the number of power amplifiers detected, the controller 114 sets the grounding switches 226 located at switching circuit nodes A, B, C and D to the appropriate positions as will be described in more detail below.

In operation, adaptive power amplifier module 100 operates as follows. For example, assuming a single power amplifier is inserted into port 200-1, the impedance at the input to the combiner 208 is 50 ohms. Using the sensor circuitry 212, the controller 114 detects a voltage control signal at sensor node 1, indicating a single power amplifier is present. No control signals are sensed at the other nodes. With a 50 ohm impedance at the combiner, it is desirable to have the output of the combiner routed to line segment 222-1. This will yield an effective impedance at node A of 50 ohms.

To effect the routing to segment 222-1, the controller 114 closes the grounding switches 226 located at nodes B, C and D. Closing the switches grounds the nodes and causes the associated $\lambda/4$ lines 222-2, 222-3 and 222-4 and 224 coupled to these switches to effectively become deactivated. At a $\lambda/4$ away from the grounded nodes, they are transformed into open circuits (i.e., high impedance) both at the output of combiner 208 and at the output 228 of the power amplifier module. On the other hand, the controller activates output transmission line segment 222-1 by causing the switch 226 at node A to be opened, or remain open. Therefore, the summed output signal from the combiner 208 will propagate through the 50 ohm, $\lambda/4$ output transmission line segment 222-1 to be output at the power amplifier module output 228.

In another example, assume power amplifiers are inserted into ports 200-1 and 200-2. Their combined impedance at the combiner 208 is 25 ohms. The controller 114 would detect voltage control signals at sensor nodes 1 and 2 as shown in FIG. 2 indicating two power amplifiers are present as 200-1, 200-2. The desirable transmission line segment is then 222-2 which is reflective of a geometric mean of 25 ohms and 50 ohms. The controller 114 then causes the grounding switches 226 at nodes A, C, and D to be closed while the switch 226 at node B would be opened. The closed switches cause the $\lambda/4$ lines 222-1, 222-3, 222-4, and 224 associated with the nodes A, C and D to be deactivated and transformed into open circuits (i.e., high impedance) both at the output of the combiner 208 and at the power amplifier module output 228. The summed output signal from combiner 208 will then propagate from the output of the combiner 208 through the activated output transmission line segment 222-2 which has an impedance of 35.35 ohms. The 25-ohm impedance that was presented to this path at the combiner 208 is transformed via the 35.35-ohm, $\lambda/4$ line 222-2 to an impedance of 50 ohms at node B. The impedance remains 50 ohms as it transitions through the 50-ohm, $\lambda/4$ transmission line segment 224 to the output of the power amplifier module 228.

The same basic operation occurs when three or four power amplifiers are inserted into ports 200. The appropriate signal path when three power amplifiers are inserted is through node C and line segment 220-3, and the appropriate signal path when four power amplifiers are inserted is through node D and line segment 220-4. Selecting the correct path ensures that the impedance from the combiner 208 to the output 228 is effectively transformed to approximately 50 ohms.

A power amplifier system as described above generally requires the use of only one switch per output line. Therefore, the total number of switches required by the system is greatly reduced. Furthermore, since the output lines are activated or deactivated by connecting the output lines to ground via the switches, the summed output signal from the combiner 208 is never required to propagate through a switch. Therefore, the switching operation of the present invention reduces the undesirable signal loss and reliability concerns that exist when multiple switches are used.

Figure 4A:
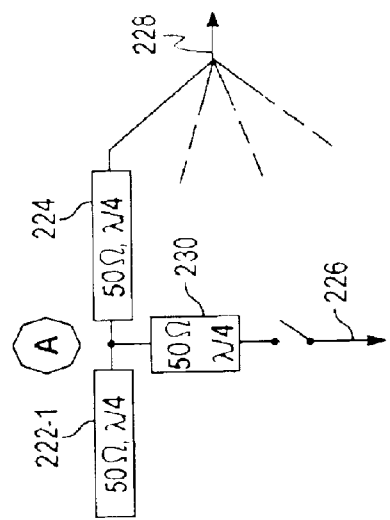
FIG. 4A is a schematic block diagram of an alternative control portion of the circuit.
Figure 4B:
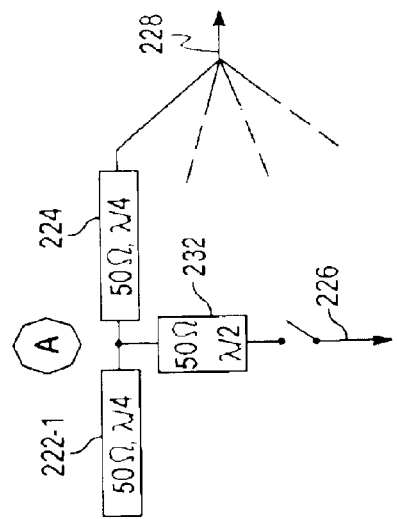
FIG. 4B is a schematic block diagram of another alternative control portion of the circuit.

FIGS. 4A and 4B illustrate additional embodiments of the invention, wherein additional transmission line segments are utilized with switches 226 to achieve a desired selection of an output transmission line segment. FIGS. 4A and 4B illustrate alternative embodiments of the invention for one of the nodes, Node A. It will be readily understood that similar alternative embodiments may be utilized for the other nodes, as well, or any number of nodes utilized in accomplishing the present invention.

Referring to FIG. 4A, utilizing switch 226, it physically may not be able to achieve the desired closed circuit/low impedance, or open circuit/high impedance characteristics at the node. Therefore, an alternative embodiment is illustrated in FIG. 4A, and an additional transmission line segment 230 may be utilized. In making the transmission line segment 230 a 50 ohm $\lambda/4$ segment, the effect on the node A from the closing of switch 226 will be an opposite effect from the effect of the embodiment as illustrated in FIG. 2. That will then also lead to an opposite effect at a distance $\lambda/4$ from node A. Therefore, in order to activate the $\lambda/4$ line 222-1, rather than leaving the switch 222 open, the switch is closed. The closed switch then translates into a high impedance at node A, but an effective low impedance at both the output of the combiner 208 and at the output 228 of the power amplifier module. Similarly, if node A is the chosen path for the output, to deactivate the other lines, the switches are left open, translating into a low impedance at each of the respective nodes, and then a high impedance at the output of combiner 208 for each of the lines. Therefore, in the example discussed above wherein one power amplifier is present, the switch 226 associated with node A is closed, wherein the other switches remain open. Similar selective closing and opening of switches 226 may be utilized to select other nodes for the output of the combiner 208.

FIG. 4B illustrates still another alternative embodiment which would effectively operate similarly to the embodiment illustrated in FIG. 2. However, an additional transmission line segment 232 is utilized in combination with switch 226 to physically achieve a desired circuit. Transmission line segment 232 is, however, $\lambda/2$ in length, and therefore, the condition at the switch 226 is realized directly at the node, such as node A. That is, as discussed with respect to the embodiment illustrated in FIG. 2, the closing of switch 226 will deactivate a particular output line and node, wherein leaving the switch open will select a particular output line and node for routing the output of the combiner 208.

In the present invention, any port 200 that does not contain a power amplifier is terminated as an open-circuit impedance by operation of a switch 226 or switch/line segment combination. This impedance is transformed, via the 50-ohm, $\lambda/2$ segment of transmission line 206, to the combiner 208 as an open circuit. This open circuit condition will have no impact on the overall impedance presented to the combiner 208 until a power amplifier is coupled. Therefore, amplifier modules with large numbers of unoccupied ports may be installed to accommodate for future growth. A new amplifier may be added at anytime, and the adaptive power amplifier module 100 will automatically adjust its operation, as described above, to ensure efficient operation.

Further, the selection of the appropriate output line 220-1, 220-2, 220-3 or 220-4 by the controller 114 is not affected by which particular ports 200 contain power amplifiers. The controller 114 needs to know that ports are occupied by power amplifiers; however, knowledge about which ports are occupied is irrelevant. Therefore, this system does not require power amplifiers to be installed in any particular one of ports 200 in any particular order. A power amplifier can be installed in any port 200 of the power amplifier module 100 and create identical performance.

A further feature of the preferred embodiment is that the switches 226 at nodes A, B, C and D may be "hot switched." That is, power amplifiers can be inserted into any one of the ports 200 without having to power down the RF input signal 102. The typical lifetime of these switches when hot switching is used is limited to several operations. If the RF input 102 to the module 100 is powered down for a few milliseconds during insertion of a power amplifier (to power levels of less than 25 dBm), the lifetime of these switches may be several million operations. Typically, these switches will see no more than 10–20 operations during their lifetime.

The adaptive power amplifier system described herein may be implemented to operate in a wide variety of frequency bands. Examples of the frequencies in which the preferred embodiment may be operated include cellular, the European 1800 MHz Digital Communication System (DCS), Personal Communication System (PCS), Universal Mobil Telecommunications System (UMTS), and Multichannel Multipoint Distribution System (MMDS) frequencies.

The descriptions of the preferred embodiments described above are set forth for illustrative purposes and are not intended to limit the present invention in any manner. Equivalent approaches are intended to be included within the scope of the present invention. While the present invention has been described with reference to the particular embodiments illustrated, those skilled in the art will recognize that many changes and variations may be made thereto without departing from the spirit and scope of the present invention. These embodiments and obvious variations thereof are contemplated as falling within the scope and spirit of the claimed invention.

We claim:

1. A power amplifier system comprising:
   a plurality of ports each being configured for accepting a power amplifier and each port having an output;
   a circuit for combining the port outputs into a combined output signal;
   a plurality of output lines;
   a controller coupled to the output lines and responsive to the occupancy of one or more of said ports by power amplifiers, said controller causing the combined output signal to be routed to at least one of said output lines based upon the occupancy of said ports by power amplifiers.

2. The system of claim 1 wherein at least two of said output lines have different electrical line characteristics.

3. The system of claim 1 wherein said controller causes the combined output signal to be routed to at least one of said output lines based upon the electrical line characteristics of the output line.

4. The system of claim 2 wherein said electrical line characteristics include impedance characteristics.

5. The system of claim 1 further comprising:
   a sensor coupled to at least one of the ports;
   said controller being responsive to said sensor to determine the occupancy of the port by an amplifier.

6. The system of claim 5 wherein said sensor comprises:
   an insert detection circuit operable for producing a voltage signal when a power amplifier is inserted into the corresponding one said ports.

7. The system of claim 1 wherein the circuit for combining the port outputs is a combiner which produces a summed output signal.

8. The system of claim 1 wherein said controller causes said output signal to be routed to one of said output lines by activating a selected output line and deactivating at least another output line.

9. The system of claim 1 wherein said controller causes said output signal to be routed to one of said output lines by activating a selected output line and deactivating all other output lines.

10. The system of claim 1 further comprising:
    a plurality of grounding switches each of which is connected to one of said output lines;
    said controller routing said output signal to the at least one of said output lines by opening said grounding switch associated with the appropriate one of said output lines and closing each said grounding switch associated with the remaining output lines.

11. The system of claim 1 further comprising:
    a plurality of grounding switches each of which is connected to one of said output lines;
    said controller routing said output signal to the at least one of said output lines by closing said grounding switch associated with the appropriate one of said output lines and opening each said grounding switch associated with the remaining output lines.

12. A power amplifier system comprising:
    a plurality of ports configured for accepting a power amplifier and each port having an output;
    a sensor coupled to each of said ports and generating a control signal corresponding to the occupancy of a port by a power amplifier;
    a combiner for combining the port outputs into a summed output signal;
    a plurality of output lines coupled to said combiner, each of said output lines having different electrical impedance characteristics;
    a controller coupled with the sensor to receive the control signal and also coupled with each of said output lines and operable for routing said summed output signal through one of said output lines based upon said control signal and said electrical impedance characteristics of the output lines.

13. The system of claim 12 further comprising:
    a plurality of switches each of which is coupled to one of said output lines;
    said controller coupled with said switches and operable for selecting an output route for said summed output signal by opening said switch coupled with one of the output lines and closing switches in the remaining output lines.

14. The system of claim 13 wherein the switches are connected between said output line and a ground contact.

15. The system of claim 12 wherein said ports allow power amplifiers to be inserted or removed without requiring the system to be shut down.

16. The system of claim 12 further comprising:
a variable amplifier coupled to inputs of each of said ports;
said controller also coupled with said variable amplifier for adjusting the amplification level of said variable amplifier based upon control signals from said sensors.

17. The system of claim 16 wherein said controller is operable to decrease the amplification of said variable amplifier when additional power amplifiers are inserted within said ports.

18. An power amplifier system comprising:
an input port for receiving an input signal;
a variable amplifier coupled to the input port to amplify said input signal;
a plurality of ports each being configured for accepting a power amplifier and each port having an output;
an insert detection circuit at each port for detecting the insertion and removal of a power amplifier in the port and for generating a respective control signal when a port is occupied;
a controller coupled with said variable amplifier and adjusting the amplification level of said variable amplifier based upon the sensing of a control signal and the occupancy of said parts by power amplifiers.

19. The system of claim 18 further comprising an input signal divider positioned between sad variable amplifier and said plurality of ports for dividing said input signal between said plurality of ports.

20. An power amplifier system comprising:
a plurality of ports each being configured for accepting a power amplifier and each port having an output;
a plurality of insert detection circuits each of which is coupled to said output of a different one of said ports, the insert detection circuit generating a voltage signal when a power amplifier is inserted into a respective one of said ports;
a combiner coupled to said outputs of said ports and producing a summed output signal;
a plurality of output lines coupled to said combiner, each of said output lines having different electrical impedance characteristics;
a controller coupled with said output lines and receiving voltage signals to determine the number of power amplifiers inserted into said ports and routing said summed output signal through one of said output lines based upon the number of power amplifiers and said impedance characteristics of one of said output lines.

21. The system of claim 20 further comprising:
a plurality of grounding switches each of which is coupled to one of said output lines;
said controller coupled to each said grounding switch and selecting an output route for said summed output signal by opening said grounding switch coupled with a selected output line and closing grounding switches coupled with other lines.

22. The system of claim 21 further comprising:
a plurality of grounding switches each of which is coupled to one of said output lines;
said controller coupled to each said grounding switch and selecting an output route for said summed output signal by closing said grounding switch coupled with a selected output line and opening grounding switches coupled with other lines.

23. A variable output apparatus for use in a system with one or more power amplifiers comprising:

a combiner coupled to one or more power amplifiers, said combiner producing a summed output signal;
a plurality of output lines coupled to said combiner wherein each of said output lines has different electrical line characteristics; and
a router coupled to each of said output lines, the router operable to route said summed output signal to at least one of said output lines with the appropriate electrical line characteristics based on the number of power amplifiers coupled to said combiner.

24. The system of claim 23 wherein said electrical line characteristics include impedance characteristics.

25. The system of claim 23 wherein said muter routes said summed output signal to at least one of said output lines by activating a selected output line and deactivating other output lines.

26. A variable output apparatus for use in a system with one or more power amplifiers comprising:
a combiner coupled to one or more power amplifiers, said combiner producing a summed output signal;
a plurality of output lines coupled to said combiner wherein each of said output lines has different electrical line characteristics; and
a plurality of grounding switches coupled to said output lines;
a controller coupled to each of said output lines, the controller operable to route said summed output signal to at least one of said output lines by one of opening and closing said grounding switch coupled with a selected output line and one of opening and closing grounding switches coupled with other output lines.

27. The apparatus of claim 26 wherein said controller is operable to route the summed output signal to at least one of said output lines based on the number of power amplifiers coupled to said combiner.

28. The apparatus of claim 26 further comprising a length of transmission line coupled between said grounding switches and their respective output lines.

29. The apparatus of claim 28 wherein said length of transmission line is a quarter wavelength section of line.

30. The apparatus of claim 28 wherein said length of transmission line is a half wavelength section of line.

31. A method for amplifying a signal comprising:
providing a plurality of ports each having an output and configured far accepting a power amplifier;
combining said outputs of each of said ports to create a summed output signal;
providing a plurality of output lines for receiving said summed output signal, each of said output lines having different electrical line characteristics; and
determining the occupancy of said ports by power amplifiers and routing said summed output signal to a selected one of said output lines with the appropriate electrical line characteristics.

32. The method of claim 31 wherein said electrical line characteristics include impedance characteristics.

33. The method of claim 31 wherein said routing step comprises:
activating said selected one of said output lines for routing said summed output signal; and
deactivating other output lines.

34. The method of claim 31 wherein said routing step comprises:
one of opening and closing a grounding switch coupled to said selected one of said output lines for routing said summed output signal; and one of opening and closing a grounding switch in other output lines.

35. A method for amplifying a signal comprising:

providing a plurality of ports each having an output and configured for accepting a power amplifier;

combining said outputs of each of said ports to create a summed output signal;

providing a plurality of output lines for receiving said summed output signal, each of said output lines having different impedance characteristics;

determining the occupancy of said ports by power amplifiers and routing said summed output signal to one of said output lines based upon the occupancy of said ports by power amplifiers and said impedance characteristics of one of said output lines.

36. The method of claim 35 wherein said routing step comprises:

activating said selected one of said output lines for routing said summed output signal; and deactivating other output lines.

37. The method of claim 35 wherein said ports include respective inputs, the method further comprising amplifying an input to a respective port and varying the amplification level based upon the occupancy of said ports by power amplifiers.

38. The method of claim 37 further comprising decreasing the amplification level the greater the number of ports occupied by power amplifiers.

39. A method for amplifying a signal comprising:

providing a plurality of ports each having an input and an output and configured for accepting a power amplifier;

determining the occupancy of said ports by power amplifiers by insert detection circuits at the ports, the insert detection circuits generating a respective control signal when the port is occupied;

amplifying an input to a respective port and varying the amplification level based upon the existence of a control signal and the occupancy of said ports by power amplifiers.

40. A method for amplifying a signal comprising:

providing a plurality of ports each having an output and configured for accepting a power amplifier;

combining said outputs of each of said ports to create a summed output signal;

providing a plurality of output lines for receiving said summed output signal, each of said output lines having different electrical line characteristics; and determining the occupancy of said ports by power amplifiers and activating a selected one of said output lines for routing said summed output signal to the selected one of said output lines with the appropriate electrical line characteristics.

41. The method of claim 40 further comprising deactivating other output lines.

42. The method of claim 40 further comprising activating a selected one of said output lines by one of opening and closing a grounding switch coupled to said selected one of said output lines.

43. The method of claim 42 wherein a length of transmission line is coupled between said grounding switch and said output line.

44. The method of claim 43 wherein said length of transmission line is a quarter wavelength section of line.

45. The method of claim 43 wherein said length of transmission line is a half wavelength section of line.

* * * * *

UNITED STATES PATENT AND TRADEMARK OFFICE
CERTIFICATE OF CORRECTION

PATENT NO. : 6,744,312 B2
DATED : June 1, 2004
INVENTOR(S) : White et al.

It is certified that error appears in the above-identified patent and that said Letters Patent is hereby corrected as shown below:

<u>Column 6,</u>
Line 45, reads "...to segment 222 and node A." and should read -- ...to segment 222-1 and node A. --

<u>Column 11,</u>
Line 24, reads "...of said parts by power amplifiers." and should read -- ...of said ports by power amplifiers. --

<u>Column 12,</u>
Line 13, reads "...wherein said muter routes said summed..." and should read -- ...wherein said router routes said summed... --
Line 45, reads "...configured far accepting a power..." and should read -- configured for accepting a power... --

Signed and Sealed this

Seventh Day of December, 2004

JON W. DUDAS
*Director of the United States Patent and Trademark Office*